United States Patent [19]

Malwah

[11] 4,373,250
[45] Feb. 15, 1983

[54] PROCESS FOR FABRICATING A HIGH CAPACITY MEMORY CELL

[75] Inventor: Manohar L. Malwah, Sunnyvale, Calif.

[73] Assignee: Signetics Corporation, Sunnyvale, Calif.

[21] Appl. No.: 207,264

[22] Filed: Nov. 17, 1980

[51] Int. Cl.³ ............................................. H01L 21/26
[52] U.S. Cl. .................................. 29/571; 29/576 B; 29/577 C; 148/187
[58] Field of Search ................. 29/571, 576 B, 577 C; 148/1.5, 187; 357/23 VT, 23 C

[56] References Cited

U.S. PATENT DOCUMENTS

| | | | |
|---|---|---|---|
| 4,060,738 | 11/1977 | Tasch, Jr. et al. | 307/238 |
| 4,112,575 | 9/1978 | Fu et al. | 29/577 C |
| 4,115,871 | 9/1978 | Varadi | 365/149 |
| 4,125,933 | 11/1978 | Baldwin et al. | 29/571 |
| 4,141,027 | 2/1979 | Baldwin et al. | 357/51 |
| 4,163,243 | 7/1979 | Kamins et al. | 357/41 |
| 4,180,826 | 12/1979 | Shappir | 29/571 X |
| 4,183,040 | 1/1980 | Rideout | 29/571 X |

Primary Examiner—G. Ozaki
Attorney, Agent, or Firm—Jerry A. Dinardo; Robert T. Mayer; Thomas A. Briody

[57] ABSTRACT

A method of fabricating an array of high capacity memory cells comprises forming a transfer gate over each cell area spaced from an adjacent isolation region to define a storage region in the semiconductor surface between the transfer gate and isolation region and to define a bit line region on the other side of the transfer gate; forming a shallow ion layer of first conductivity type in the storage region self-aligned with the transfer gate; forming a deep ion layer of opposite conductivity type in the storage region self-aligned with the transfer gate; forming a storage gate over a portion of the storage region spaced laterally from the transfer gate to form a gap between the storage and transfer gates; and introducing ions of the first conductivity type into the portion of the storage region defined by the gap to at least neutralize some ions in the deep ion layer.

8 Claims, 10 Drawing Figures

PROCESS FOR FABRICATING A HIGH CAPACITY MEMORY CELL

BACKGROUND OF THE INVENTION

This invention relates to memory cells for random access memories and particularly to an improved process for fabricating a memory cell of the kind comprising a single transistor.

The single transistor RAM cell comprises a storage capacitor and a MOS transistor. The storage capacitor lies in a storage region of a semiconductor surface and the transistor lies next to the storage region in a transfer region of the semiconductor surface. The drain of the MOS transistor lies within the storage region.

It is known that the storage capacitance of a single transistor dynamic RAM cell includes a parallel combination of oxide capacitance and depletion capacitance. Such a memory cell is called a high capacity memory cell. In the storage region of the cell the depletion capacitance is enhanced by introducing a shallow ion layer and a deep ion layer one above the other. The shallow ion layer includes majority carriers of a first conductivity type opposite that of the substrate, and the deep ion layer includes majority carriers of a second conductivity type opposite that of the shallow ion layer and the same as that of the substrate. Thus, for a P type substrate, the shallow ion layer can be formed by introducing N type ions or donors and the deep ion layer can be formed by introducing P type ions or acceptors below the shallow ion layer. A high capacity cell and several methods of fabricating such a cell is disclosed in U.S. Pat. No. 4,112,575 to FU et al.

In fabricating a high capacity dynamic RAM cell it is important to avoid potential barriers at the interface between the storage and transfer regions, which would tend to reduce the charge capacity of the cell. Furthermore, there is a need for a simplified process of fabricating the memory cell.

SUMMARY OF THE INVENTION

A method of fabricating an array of high capacity memory cells comprises forming isolation regions on the surface of a semiconductor substrate which are patterned to produce a multiplicity of cell areas. A pattern of conductive material is formed over the semiconductor surface to form a transfer gate over each cell area that is spaced from an adjacent isolation region and to define a storage region in the semiconductor surface adjacent to one side of the transfer gate between the transfer gate and the adjacent isolation region, and also to define a bit line region on the other side of the transfer gate.

Ions having majority carriers of first conductivity type are introduced in the storage region to form a shallow ion layer self-aligned with the transfer gate. Ions having majority carriers of second conductivity type opposite the first conductivity type are introduced in the storage region to produce a deep ion layer therein beneath the shallow ion layer and self-aligned with the transfer gate.

A storage gate of conductive material is formed over a portion of the storage region and spaced laterally from the transfer gate to produce a gap between the storage and transfer gates. Ions having majority carriers of the first conductivity type are introduced into the portion of the storage region defined by the gap and into the bit line region to complete the memory cell. The ions of first conductivity type introduced into the gap region overcompensate the deep ions of the second conductivity type so that no potential barrier is formed underneath the transfer device. This results in an overall increase in the charge capacity of the memory cell.

DETAILED DESCRIPTION OF THE PREFERRED EMBODIMENT

Figure 1:
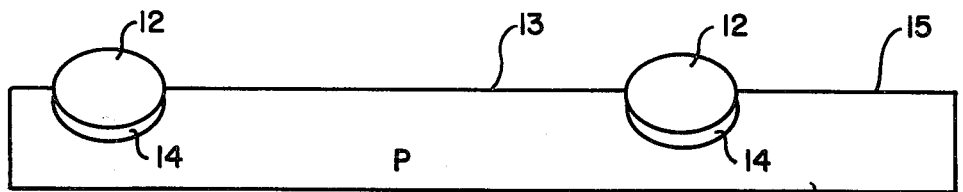
FIGS. 1-10 are cross-sectional views of a memory cell illustrating the various stages of the process according to the invention.

Referring now to FIG. 1, there will be described a process for fabricating a one transistor high capacity dynamic RAM cell. The specific description is for an N channel device but the principles are applicable to a P channel device with suitable modification of the conductivity types for the substrate and the impurity ions. In FIG. 1, a surface of a P type semiconductor substrate 10 is provided with isolation regions comprising field oxide regions 12 and channel stop regions 14 to produce an array of cell areas 13 between the isolation regions. A peripheral area 15 is located outside the cell areas 13. The field oxide regions 12 may be produced by selective oxidation treatment of a silicon semiconductor substrate surface using silicon nitride as a mask. The thickness of the field oxide regions 12 is about 8000 angstroms. The channel stop regions 14 have the same conductivity type as the substrate and may be produced by implanting boron ions with a sufficient energy and dosage to produce the desired channel stop threshold.

Figure 2:
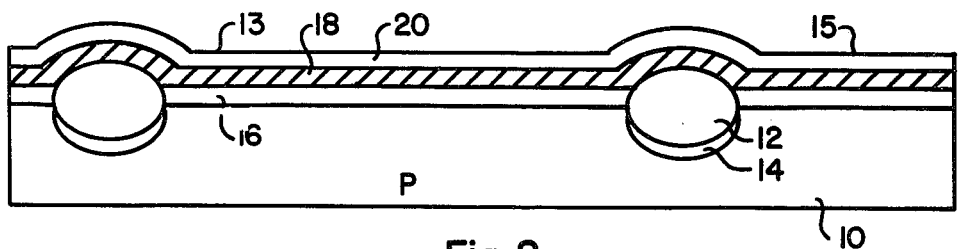

In FIG. 2, the entire surface of the semiconductor substrate 10 is shown covered with a first oxide layer 16. The first oxide layer 16 may be a thermally grown oxide layer using either steam or dry oxygen and hydrogen chloride gas ambient. The thickness of the gate oxide layer 16 is in the range of about 450-600 angstroms.

A layer 18 of low pressure chemical vapor deposition (LPCVD) polysilicon is deposited on the oxide layer 16. The polysilicon layer 18 is doped N type, such as with phosphorus or arsenic, and may be about 0.5 microns thick. The polysilicon layer 18 is then covered with a layer 20 of LPCVD deposited silicon nitride of about 1250-1500 angstroms thickness.

Figure 3:
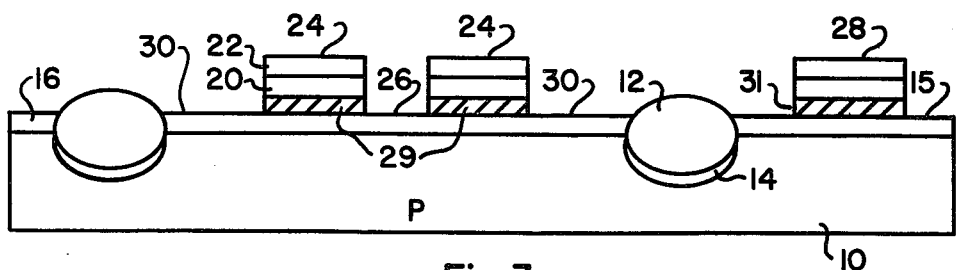

Referring now to FIG. 3, a masking step is performed to define transfer devices and peripheral transistors. With the use of a photoresist mask 22, the silicon nitride and polysilicon layers 20 and 18, respectively, are plasma etched to remove selected portions thereof and thereby define two transfer device regions 24 that are spaced laterally from each other by a bit line region 26, and also to define a peripheral transistor region 28. The transfer device regions 24 are spaced laterally from the isolation regions 12, 14 by a storage region 30. In one masking step, therefore, all of the regions of the one transistor cells are defined, as are the bit lines and the peripheral transistors. In the transfer device regions 24, the portions of the polysilicon layer 18 that remain constitute transfer gates 29 and in the peripheral transistor region 28, the polysilicon layer portion constitutes a transistor gate 31.

Figure 4:
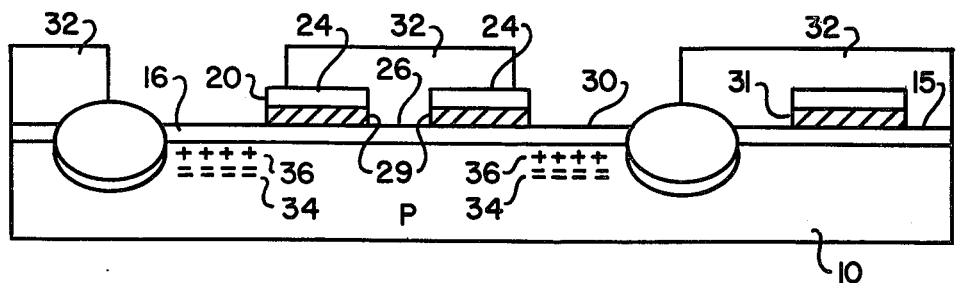

Referring now to FIG. 4, a thick layer 32 of photoresist is applied covering the transfer device regions 24, bit line region 26 and peripheral region 15, using a photomasking step. The photoresist layer 32 may be about 1.5 microns thick. This masking step exposes only the storage capacitor regions 30 of the dynamic RAM cell to implant. Boron ions are implanted in the storage regions 30 to produce a deep ion layer 34 of P type majority carriers, and arsenic is also implanted in the storage regions 30 to produce a shallow ion layer 36 of N type majority carriers.

Figure 5:
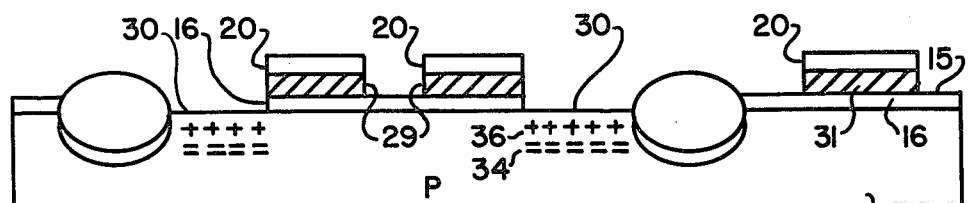
Figure 6:
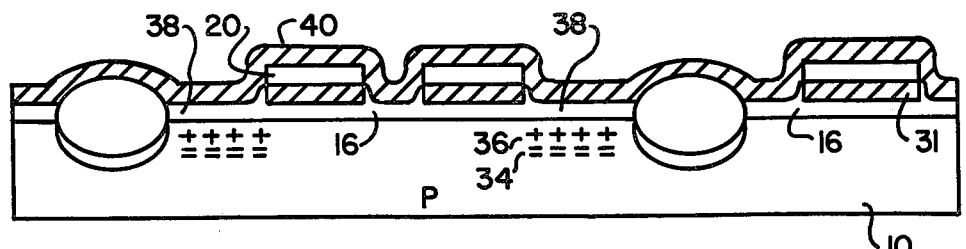

FIG. 5 shows removal by etching of the oxide layer 16 in the storage capacitor regions 30 as well as removal of the thick photoresist layer 32. The wafer is then thermally oxidized, as shown in FIG. 6, in wet or dry $O_2$, HCl ambient to form a storage gate oxide 38 in the storage capacitor region of the RAM cell. Following the growth of the storage gate oxide 38, the entire surface of the wafer is covered with a second polysilicon layer 40, which is doped N type, with arsenic for example.

Figure 7:
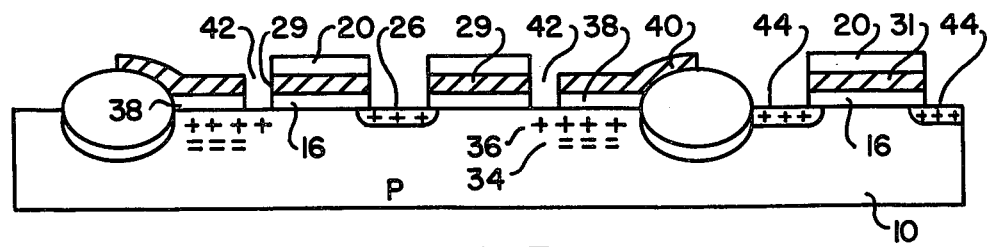

Referring now to FIG. 7, by means of photolithography, the second polysilicon layer 40 is patterned to define the polysilicon gate in the storage region. The edge of the polysilicon storage gate 40 is offset from the edges of the polysilicon transfer gates 29 by a gap 42 of about 0.5 to 1.0 micron. A photoresist mask may be used to plasma etch the polysilicon storage gate layer 40. Following this, the oxide is etched from all regions not covered by polysilicon and silicon nitride, thus exposing the semiconductor surface in the bit line region 26, the gap region 42, and the regions 4 on both sides of the transistor gate 31 that are to serve as source and drain of the peripheral transistor.

The next step comprises an arsenic or N type implant in the bit line region 26, in the peripheral source and drain regions 44 and in the gap region 42 between the transfer gate 29 and the storage gate 40. In the gap region 42 the N type implant overcompensates the P type ions of the deep ion layer 34 so that no potential barrier is formed under the transfer regions. This increases the overall capacity of the storage cell.

Figure 8:
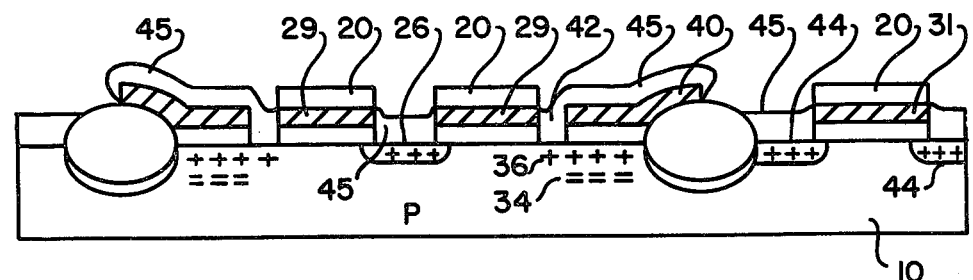

After the arsenic implant, the wafer is annealed at about 1000° C. and then oxidized at 900° C. in wet ambient to form an oxide layer, as shown in FIG. 8, over the last implanted silicon substrate regions.

Figure 9:
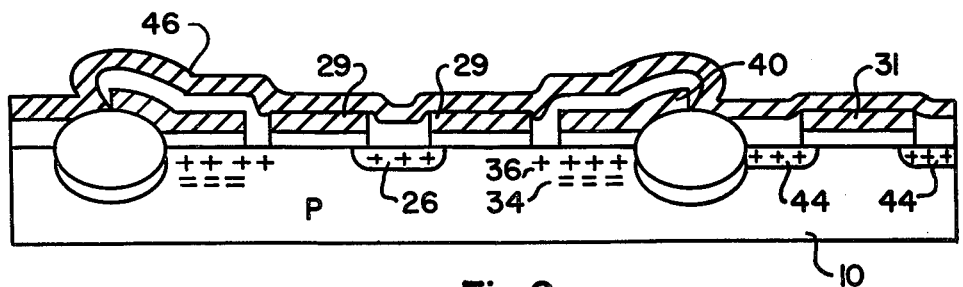
Figure 10:
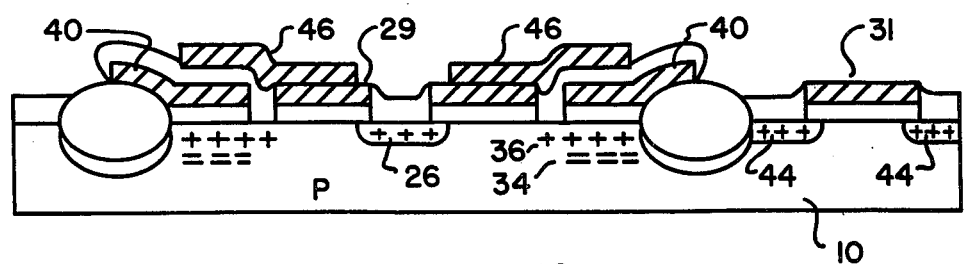

As shown in FIG. 9, the silicon nitride layer 20 is then removed from the transfer gates 29 and the peripheral transistor gate 31. A third polysilicon layer 46 is deposited over the wafer and doped N type. The third doped polysilicon layer 46 is patterned, as shown in FIG. 10, so that it extends from the transfer gate 29 and laps over the storage gate 40. This will allow a contacting metal to make contact to the transfer gate at a location over the storage region.

In each cell area shown in FIG. 10 there are produced two storage devices and two transfer devices. The bit line region 26 serves as a source for each of the transfer devices on either side of it, and each of the storage capacitor regions also contains within it the drain for one of the transfer devices.

What is claimed is:

1. A method of fabricating an array of high capacity memory cells, comprising:

(a) forming isolation regions in a surface of a semiconductor substrate which are patterned to form a multiplicity of cell areas;
    (b) forming a pattern of conductive material over said semiconductor surface insulated therefrom to form a transfer gate over each cell area spaced from an adjacent isolation region and to define a storage region in said semiconductor surface adjacent to one side of said transfer gate between said transfer gate and said adjacent isolation region and also to define a bit line region on the other side of said transfer gate;
    (c) introducing ions having majority carriers of first conductivity type in said storage region to form a shallow ion layer therein self-aligned with said transfer gate;
    (d) introducing ions having majority carriers of second conductivity type opposite said first conductivity type in said storage region to form a deep ion layer beneath said shallow ion layer self-aligned with said transfer gate;
    (e) forming a storage gate of conductive material over a portion of said storage region and spaced laterally from said transfer gate to form a gap between said storage and transfer gates; and
    (f) introducing ions having majority carriers of said first conductivity type into the portion of said storage region defined by said gap and into said bit line region to at least neutralize some of the ions in said deep ion layer and also to produce a bit line which may serve as the source region of a transistor.

2. The invention according to claim 1, wherein said substrate comprises second conductivity type material.

3. The invention according to claim 2, wherein said substrate comprises P type conductivity material.

4. The invention according to claim 1, wherein said pattern of conductive material forms two transfer gates in each cell area that are spaced apart by a single bit line region, with each transfer gate spaced from an isolation region by a storage region.

5. The invention according to claim 1, wherein said pattern of conductive material extends over a peripheral region adjacent to a cell area and forms a peripheral transfer gate spaced from an isolation region to define regions on opposite sides thereof for the formation of source and drain.

6. The invention according to claim 1 and further including forming a layer of insulating material over said storage gate, and forming an additional pattern of conductive material over said transfer gate and said layer of insulating material in contact with said transfer gate and overlapping but insulated from said storage gate by said layer of insulating material.

7. The invention according to claim 6, wherein the conductive material in steps (b) and (e) and said additional pattern comprise doped polysilicon.

8. The invention according to claim 1, wherein said semiconductor substrate is formed of silicon and step (b) is preceded by forming on the substrate an oxide insulating layer upon which said conductive pattern is produced.

* * * * *